United States Patent [19]

Montagne

[11] Patent Number: 5,400,022
[45] Date of Patent: Mar. 21, 1995

[54] PULSE CODE BIT CELL DEMODULATION

[75] Inventor: Raymond B. Montagne, Mountain View, Calif.

[73] Assignee: Apple Computer, Inc., Cupertino, Calif.

[21] Appl. No.: 136,699

[22] Filed: Oct. 15, 1993

[51] Int. Cl.⁶ ............................................. H03M 5/08
[52] U.S. Cl. ........................................ 341/53; 375/22
[58] Field of Search .................... 341/53, 54, 56, 58, 341/71; 375/22, 23

[56] References Cited

U.S. PATENT DOCUMENTS 3,593,334  7/1971  Bickel .................................. 341/53
4,694,468  9/1987  Cullum ................................. 375/10

Primary Examiner—Brian K. Young
Attorney, Agent, or Firm—Burns, Doane, Swecker & Mathis

[57] ABSTRACT

A method and apparatus for demodulating a pulse width modulated (PWM) signal previously modulated with either a first or second data value comprises sensing an actual duration of the first period of the bit cell, and generating an actual first signal value that is proportional to the actual duration of the first period of the bit cell. Using the actual first signal value and an expected first signal value, a first adjustment amount is determined and used for adjusting the actual first signal value. Then, an actual duration of the second period of the bit cell is sensed. The adjusted actual first signal value is further adjusted by a second adjustment amount to produce a final adjusted signal value, the second adjustment amount being proportional to the actual duration of the second period of the bit cell. Finally, a signal is generated which alternatively has a first value or a second value in correspondence with the final adjusted signal alternatively being greater than or not greater than a reference value. Alternative embodiments of the method and apparatus include an accurate as well as an approximate determination of the first adjustment amount.

21 Claims, 5 Drawing Sheets

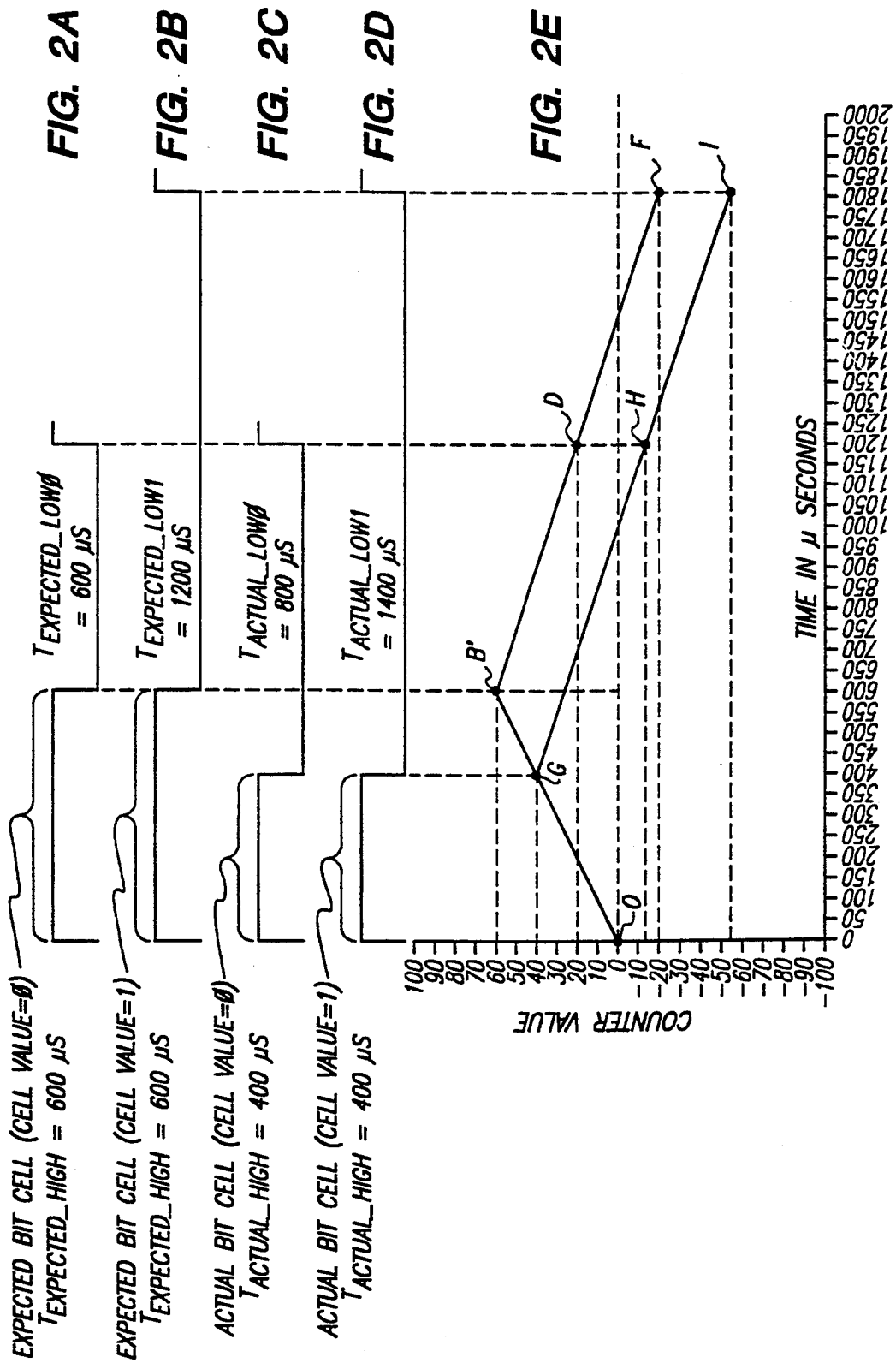

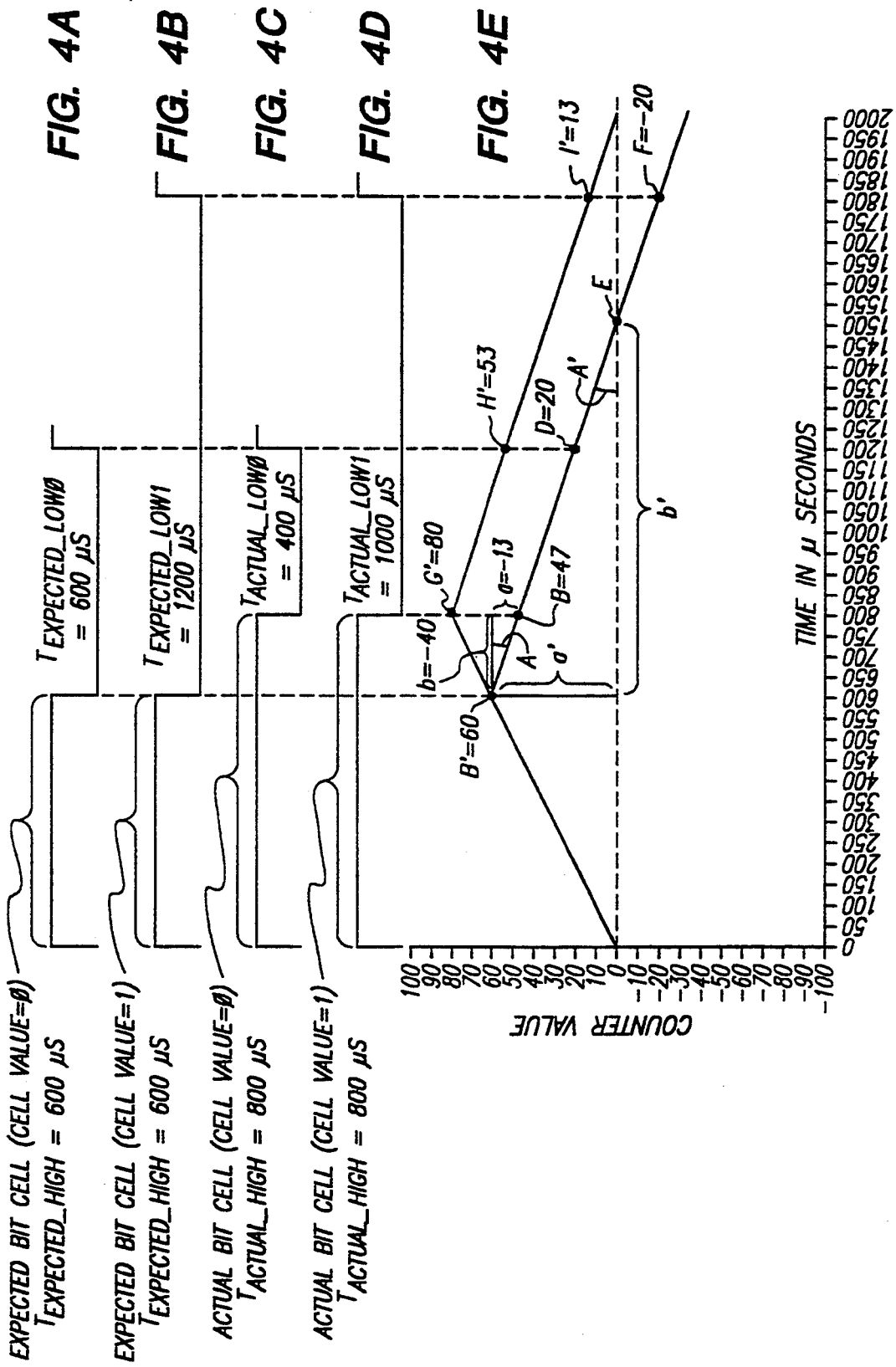

PULSE CODE BIT CELL DEMODULATION

BACKGROUND

The present invention relates to demodulation of pulse code bit cells, and more particularly to a compensation technique and apparatus for correctly demodulating a pulse code bit cell whose high and low periods have been distorted.

A remote control unit permits a user to operate a device from a location that is at some distance from the device. Wireless remote control units dispense with the need for the unit to be physically cabled to the device to be controlled, and therefore provide additional convenience to the user. Consumers are now familiar with the use of wireless remote control units for controlling many of their home devices, such as audio and video equipment. Furthermore, the benefits offered from wireless remote control continue to provide motivation for imbedding this feature into other types of devices, such as personal computers.

A typical remote control unit operates by transmitting a beam of infrared light to a receiver located at or near the device to be controlled. It is usually necessary for the infrared light to be encoded with information that identifies the particular function requested by the user. This is typically accomplished by mapping each function to a unique string of "0's" and "1's" and then using a form of pulse width modulation (PWM) to encode these "0's" and "1's" into the transmitted infrared light beam. At the device, an infrared interface receives the modulated infrared light beam, and then demodulates the beam to recover the "0's" and "1's" and, in turn, identify the command to be performed.

In pulse width modulation, a pulse carrier is modulated in a manner wherein the value to be encoded (in this case, either a "0" or a "1") produces a pulse of proportional duration. FIGS. 1a and 1c illustrate modulated pulses. FIG. 1a depicts a bit cell that has been modulated to correspond to the digit "0". The bit cell consists of a high period 101 and a low period 103. The duration of the high period 101 is T1, and the duration of the low period 103 is T2, which, in this case, is equal to T1.

FIG. 1c depicts a bit cell that has been modulated to correspond to the digit "1". This bit cell also has a high period 101' and a low period 103'. In this type of encoding, the high period is fixed, so that the duration of high period 101' is T1, just as in the encoding of the digit "0". However, unlike the bit cell of FIG. 1a, the bit cell of FIG. 1c has a low period 103' that is twice as long as the duration of the high period 101' That is, for the encoding of the digit "1" $T2'=2\times T1'=2\times T1$. Consequently, the binary value of any given bit cell can be determined by evaluating the ratio of low versus high periods of the bit cell. If the low period has a duration equal to the high period, then the encoded digit is a "0". Otherwise, if the duration of the low period is twice as long as that of the high period, then the encoded digit is a "1".

A known method for evaluating a bit cell is to begin counting up from zero, at a first fixed repetition rate, during the high period of the bit cell. Then, during the low period of the bit cell, this count is decreased by one at a second, slower repetition rate so that the time period between each decrement (the "count-down interval"), represented by $T_{DOWN}$, is 50% longer than the time period between each of the previous increments (the "count-up interval"), represented by $T_{UP}$. At the end of the bit cell, the sign of the resulting count corresponds to the value that was encoded in the bit cell. That is, if the resulting count is positive, then the bit cell represented the value "0". If the resulting count is negative, then the bit cell represented the value "1".

This is illustrated in FIGS. 1b and 1d, which depict the counting operations for corresponding bit cells depicted in FIGS. 1a and 1c, respectively. In FIG. 1b, the count begins at zero, and counts up during the high period 101 at a rate equal to $RATE_{UP}=1/T_{UP}$, until a count equal to $COUNT_{HIGH}=T1\times RATE_{UP}=T1/T_{UP}$ is reached. Then the count is decreased by one during the low period 103 at a rate equal to $RATE_{DOWN}=1/T_{DOWN}$, until a final count equal to $COUNT_{LOW}=COUNT_{HIGH}-(T2\times RATE_{DOWN})=COUNT_{HIGH}-T1/T_{DOWN}$ is reached. Because $T_{DOWN}=T_{UP}+(T_{UP}/2)$, and T2=T1, this count will be positive, indicating that the bit cell was encoded as a value "0".

Similarly, FIG. 1d illustrates the counting operation for the bit cell shown in FIG. 1c. In FIG. 1d, the count also begins at zero, and counts up during the high period 101' at a rate equal to $RATE_{UP}=1/T_{UP}$, until a count equal to $COUNT_{HIGH}'=T1'\times RATE_{UP}=T1'/T_{UP}$ is reached. Then, during the low period 103' the count is decreased by one at a rate equal to $RATE_{DOWN}=1/T_{DOWN}$, until a final count equal to $$COUNT_{LOW}' = COUNT_{HIGH}' - (T2' \times RATE_{DOWN})$$
$$= COUNT_{HIGH}' - 2 \times T1'/T_{DOWN}$$

is reached Because $T_{DOWN}=T_{UP}+(T_{UP}/2)$, and Ti'=T1, this count will be negative, indicating that the bit cell was encoded as a value "1".

In practice, the modulated infrared light beam is usually transmitted as a binary data stream which is preceded by an Automatic Gain Control (AGC) burst. The purpose of the AGC burst is to provide an AGC circuit, which is located in the infrared detector, with a sample signal so that the gain of the receiver will be set properly for correct detection of the data stream. Infrared data formats typically require that data be repeated so that erroneous evaluation of the data stream can be avoided by discarding data that does not match previously transmitted data. Typically, three successive data streams must be evaluated to produce the same result before that data is accepted as being valid.

A problem with the above-described prior art technique is that errors in data stream evaluation can be introduced as a result of incorrect initial gain settings in the AGC hardware. When this happens, the period of the high portion of the received bit cell becomes shorter while the low portion of the bit cell becomes longer. The lengthening of the low portion of the cell is approximately equal to the period by which the high portion is shortened, so that the duration of the entire bit cell remains approximately constant. It may also be possible for the AGC circuit to produce timing errors in the opposite direction, so that the high portion of the received bit cell becomes longer than that of the transmitted bit cell, and the low portion of the received bit cell becomes shorter.

When this type of error occurs, the duration of the count-up operation is affected, causing the COUN- $T_{HIGH}$ value to be incorrect. This, combined with an incorrect count-down duration, then causes the final $COUNT_{LOW}$ value to be wrong. If the $COUNT_{LOW}$ value has the wrong sign, then the bit-cell will be wrongly evaluated.

This problem reoccurs until the data stream has been repeated a sufficient number of times so that the AGC circuit stabilizes at the correct gain amount. The number of iterations required to stabilize the AGC circuit varies with signal quality. It has been observed that the first two data streams are rarely evaluated properly using the standard evaluation methodology described above.

SUMMARY

It is therefore an object of the present invention to provide methods and apparatus for accurately evaluating the encoded value of a bit cell in the presence of errors which affect the duration of the received high and low bit cell periods.

It is another object of the present invention to provide methods and apparatus for accurately evaluating the encoded value of a bit cell by using only integer arithmetic.

In accordance with the present invention, methods and apparatus demodulate a pulse width modulated signal previously modulated with at least one data value selected from the group consisting of first and second values, such as "0" and "1". The pulse width modulated signal comprises at least one bit cell corresponding to the at least one data value. Each of said bit cells comprises a first period and a second period, the first period having a first duration and the second period alternatively having a second duration or a third duration in correspondence with the corresponding data value being, alternatively, the first value or the second value.

In accordance with one aspect of the invention, the method comprises, for each of the bit cells, sensing an actual duration of the first period of said bit cell, and generating an actual first signal value that is proportional to the actual duration of the first period of the bit cell. Then, using the actual first signal value and an expected first signal value, a first adjustment amount is determined and then used for adjusting the actual first signal value. Next, the method includes sensing an actual duration of the second period of said bit cell, and then further adjusting the adjusted actual first signal value by a second adjustment amount to produce a final adjusted signal value, the second adjustment amount being proportional to the actual duration of the second period of said bit cell. Finally, the method includes generating a signal alternatively having the first value or the second value in correspondence with the final adjusted signal alternatively being greater than or not greater than a reference value.

In accordance with an additional feature of this embodiment, the step of determining the first adjustment amount comprises determining a time difference by subtracting a duration of an actual first period of the bit cell from a duration of an expected first period of the bit cell, and then multiplying the time difference by a predetermined ratio to produce the first adjustment amount. The predetermined ratio may represent a proportion by which the adjusted actual first signal value is adjusted per unit of time during the further adjusting step.

In accordance with another embodiment of the present invention, the method comprises, for each of the bit cells, initializing an actual count value to a first count value, then repetitively sampling the pulse width modulated signal at first intervals during the first period of the bit cell. At each of the first intervals, the actual count value is adjusted by a first increment. The method also includes detecting an end of the first period and, in response thereto, using the adjusted actual count value and an expected count value to determine a corrected count value. Next, the pulse width modulated signal is repetitively sampled at second intervals during the second period of the bit cell, the corrected count value being adjusted by a second increment at each of said second intervals. The method further includes detecting an end of the second period and, in response thereto, generating a signal alternatively having the first value or the second value in correspondence with the adjusted corrected count alternatively being greater than or not greater than a reference value.

In a further embodiment of the present invention, the first period may precede the second period in each said bit cell.

In a still further embodiment of the present invention, the first period is a high period, and said second period is a low period.

In yet another embodiment of the present invention, the second increment has a sign that is opposite in polarity to a sign of the first increment.

In a still further embodiment of the present invention, the reference value is 0.

The pulse width modulated signal is a pulse width modulated infrared light beam in another embodiment of the invention.

In accordance with an additional feature of the present invention, the corrected count value is determined by adding to the expected count value an amount substantially equal to a frequency of the second intervals multiplied by a difference in time between a duration of an expected first period of said bit cell and a duration of an actual first period of said bit cell.

In a still further embodiment of the present invention, the step of determining the corrected count value is performed with use of integer arithmetic only.

In yet another embodiment of the present invention, the step of determining the corrected count value comprises subtracting the adjusted actual count value from the expected count value to produce a difference value, multiplying the difference value by one half, and then adding one half the difference value to the expected count value to produce the corrected count value.

In a still further embodiment of the inventive method, the steps of subtracting, multiplying and adding are performed only when the adjusted actual count value is less than said expected count value, and the step of determining the corrected count value further comprises using the adjusted actual count value as the corrected count value when the adjusted actual count value is not less than the expected count value.

In accordance with yet another embodiment of the present invention, an apparatus for demodulating a pulse width modulated signal comprises first sensing means for sensing an actual duration of said first period of said bit cell. First count means are coupled to the first sensing means, for generating an actual count value that is proportional to the actual duration of the first period of the bit cell. Count correction means, coupled to the first count means, use the actual count value and an expected count value to determine a corrected count value. The apparatus further comprises second sensing means for sensing an actual duration of the second period of the bit cell; and second count means, coupled to the count correction means and the second sensing means, for adjusting the corrected count value by an adjustment amount to produce a final adjusted count. The adjustment amount is proportional to the actual duration of the second period of the bit cell. The apparatus also comprises signal generating means, coupled to the second count means, for generating a signal alternatively having a first value or a second value in correspondence with the final adjusted count alternatively being greater than or not greater than a reference value.

In accordance with the present invention, the pulse width modulated signal is a pulse width modulated infrared light beam, and the apparatus further comprises an infrared interface, coupled to the first sensing means, for detecting the pulse width modulated infrared light beam and producing therefrom a pulse width modulated electrical signal which is supplied to the first sensing means.

The method and apparatus of the invention, by sensing the duration of the first period of the bit cell and adjusting the count accordingly, is able to correctly demodulate a pulse width modulated signal in the presence of errors which distort the duration of the high and low periods of the bit cell.

BRIEF DESCRIPTION OF THE DRAWINGS

The objects and advantages of the invention will be understood by reading the following detailed description in conjunction with the drawings in which:

FIGS. 2a–2d compare expected pulses with actual pulses having high periods that are too short and low periods that are too long;

FIG. 2e is a graph of count values used for demodulating the pulses of FIGS. 2a–2d in accordance with the present invention;

FIGS. 4a–4d compare expected pulses with actual pulses having high periods that are too long and low periods that are too short;

FIG. 4e is a graph of count values used for demodulating the pulses of FIGS. 4a–4d in accordance with the present invention;

DETAILED DESCRIPTION

Figure 1A:
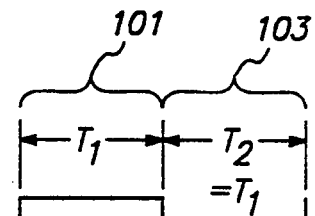
FIGS. 1a–1d depict modulated pulses encoded to convey the values "0" and "1" and prior art counting operations involved in the demodulation process.
Figure 1B:
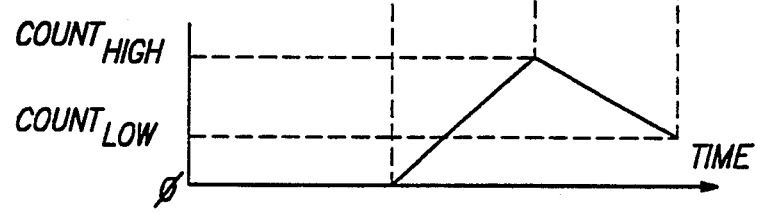
Figure 1C:
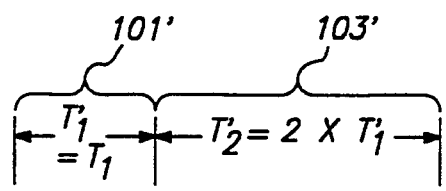
Figure 1D:
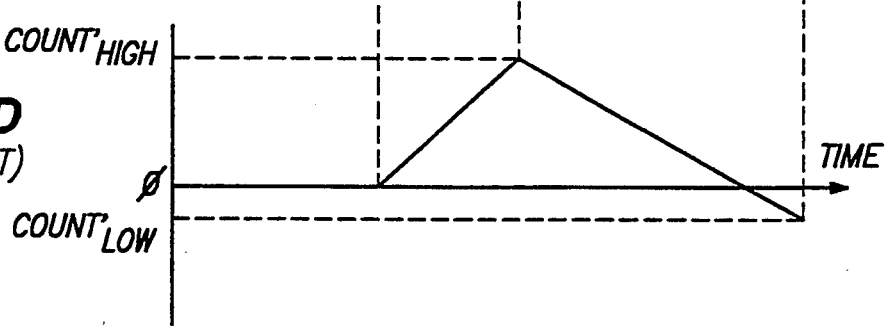

The present invention relies on the observation that one period, such as the high period, of each bit cell, whether it is encoded as a "0" or a "1" is expected to be a constant, known quantity. Accordingly, errors that are detected in the measured high period of a received bit cell are then utilized to correct measurements made during the low period of the bit cell. This is accomplished, in one embodiment of the invention, by adding a correction factor to the count that is accumulated during the high period of the bit cell. The corrected count then ensures that the final count at the end of the count-down operation will have a sign which accurately indicates whether the encoded value was a "0" or a "1". An exemplary embodiment of the above-described method will now be described in greater detail with reference to FIGS. 2a–2f. In the following description, the word "expected" is used to indicate a waveform or other value that one would expect to receive or compute in the absence of any introduced errors. These are the waveforms and computed values that conform to the design of the system. In contrast, the word "actual" is used to describe a waveform or other value as it is actually received or computed after possibly being subjected to an error-inducing processing stage. In practice, "actual" waveforms and computed values are not known ahead of time, since the amount of error may vary from time to time. Consequently, "actual" values must be measured at the time the bit cell is received.

FIG. 2a depicts a first expected (i.e., non-distorted) bit cell that represents a value of "0" and FIG. 2b shows a second expected bit cell representing the value "1". For both bit cells, the duration of the high period, represented by the term "$T_{EXPECTED\_HIGH}$", is shown as 600 µS. For the first expected bit cell of FIG. 2a, the duration of the low period, represented by the term "$T_{EXPECTED\_LOW0}$", is also shown as 600 µS, indicating that the bit cell represents a "0". The duration of the low period of the second expected bit cell of FIG. 2b, represented by the term "$T_{EXPECTED\_LOW1}$", is 1200 µS, indicating that the second expected bit cell represents a value of "1".

FIG. 2c is an example of a first actual bit cell which is supposed to represent the value "0". FIG. 2d is an example of a second actual bit cell which is supposed to represent the value "1". However, because of an introduced error, such as the type of error described above with respect to an incorrect gain setting produced by the AGC hardware, the first and second actual bit cells have high and low periods whose duration has been distorted. In this example, the duration of the high period of both the first and second actual bit cells, represented by the term "$T_{ACTUAL\_HIGH}$", is 400 µS. Thus, the introduced error has caused the high period to be shortened by an amount equal to 600 µS−400 µS=200 µS. For the first actual bit cell of FIG. 2c, the duration of the low period, represented by the term "$T_{ACTUAL\_LOW0}$", is shown as 800 µS Since this value should have been 600 µS to indicate a value "0" the duration of the low period has been extended by 200 µS. The duration of the low period of the second actual bit cell of FIG. 2d, represented by the term "$T_{ACTUAL\_LOW1}$", is 1400 µS. Since this value should have been 1200 µS to indicate a value "1" the duration of the low period in this instance has also been extended by 200 µS. Note that in both cases, the high periods have been shortened by an amount that is substantially equal to the amount by which the respective low periods have been extended, so that the entire duration of the bit cell is still substantially equal to the entire duration of a corresponding expected bit cell. Of course, those skilled in the art will recognize that the various values described here are for the purpose of illustration only, and that the selection of such values is a matter of design choice which does not affect the practice of the invention.

FIG. 2e is a graph of count values for the bit cells of FIGS. 2a–2d, plotted as a function of time. Looking at expected counts first, it can be seen that the initial counter value is zero at the point labeled O. For this example, the count-up interval, $T_{UP}$, is equal to 10 μS, so the count increases from 0, at point 0 on the graph of FIG. 2e, to a value of $COUNT_{EXPECTED\_HIGH} = 600$ μS × 1 count/10 μS = 60 during the high period of both the first and second expected bit cells. This is shown as point B' on the graph of FIG. 2e.

For this example, the count-down interval, $T_{DOWN} = T_{UP} + (\frac{1}{2} \times T_{UP}) = 15$ μS. Consequently, for the first expected bit cell, the count would then decrease from 60 to a value of $COUNT_{EXPECTED\_LOW0} = 60 - 600$ μS × 1 count/15 μS = 20. This is shown as point D on the graph of FIG. 2e. The positive sign of this result correctly indicates that the first bit cell represents a value of "0".

By comparison, for the second expected bit cell the count decreases from $COUNT_{EXPECTED\_HIGH} = 60$ at point B' to a value of $COUNT_{EXPECTED\_LOW} = 60 - 1200$ μS × 1 count/15 μS = −20. This is shown as point F on the graph of FIG. 2e. The negative sign of this result correctly indicates that the second bit cell represents a value of "1".

Very different results are achieved for the actual first and second bit cells. For both the first and second actual bit cells, the count increases from 0, at point 0 on the graph of FIG. 2e, to a value of $COUNT_{EXPECTED\_HIGH} = 400$ μS × 1 count/10 μS = 40 during their respective high periods. This is shown as point G on the graph of FIG. 2e.

Then, for the first actual bit cell, the count decreases from 40, at point G on the graph, to a value of $COUNT_{ACTUAL\_LOW0} = 40 - 800$ μS × 1 count/15 μS = −13.333. This is shown as point H on the graph of FIG. 2e. The effects of the error are evident here, because the negative sign of this result incorrectly indicates that the first bit cell represents a value of "1" when it should represent a value of "0".

For the second actual bit cell, the count decreases from $COUNT_{ACTUAL\_HIGH} = 40$ at point G to a value of $COUNT_{ACTUAL\_LOW1} = 40 - 1400$ μS × 1 count/15 μS = −53.333. This is shown as point I on the graph of FIG. 2e. The negative sign of this result correctly indicates that the second bit cell represents a value of "1". However, this is small consolation, when one considers that all of the data is being decoded as a value of "1" regardless of its true value.

Figure 3:
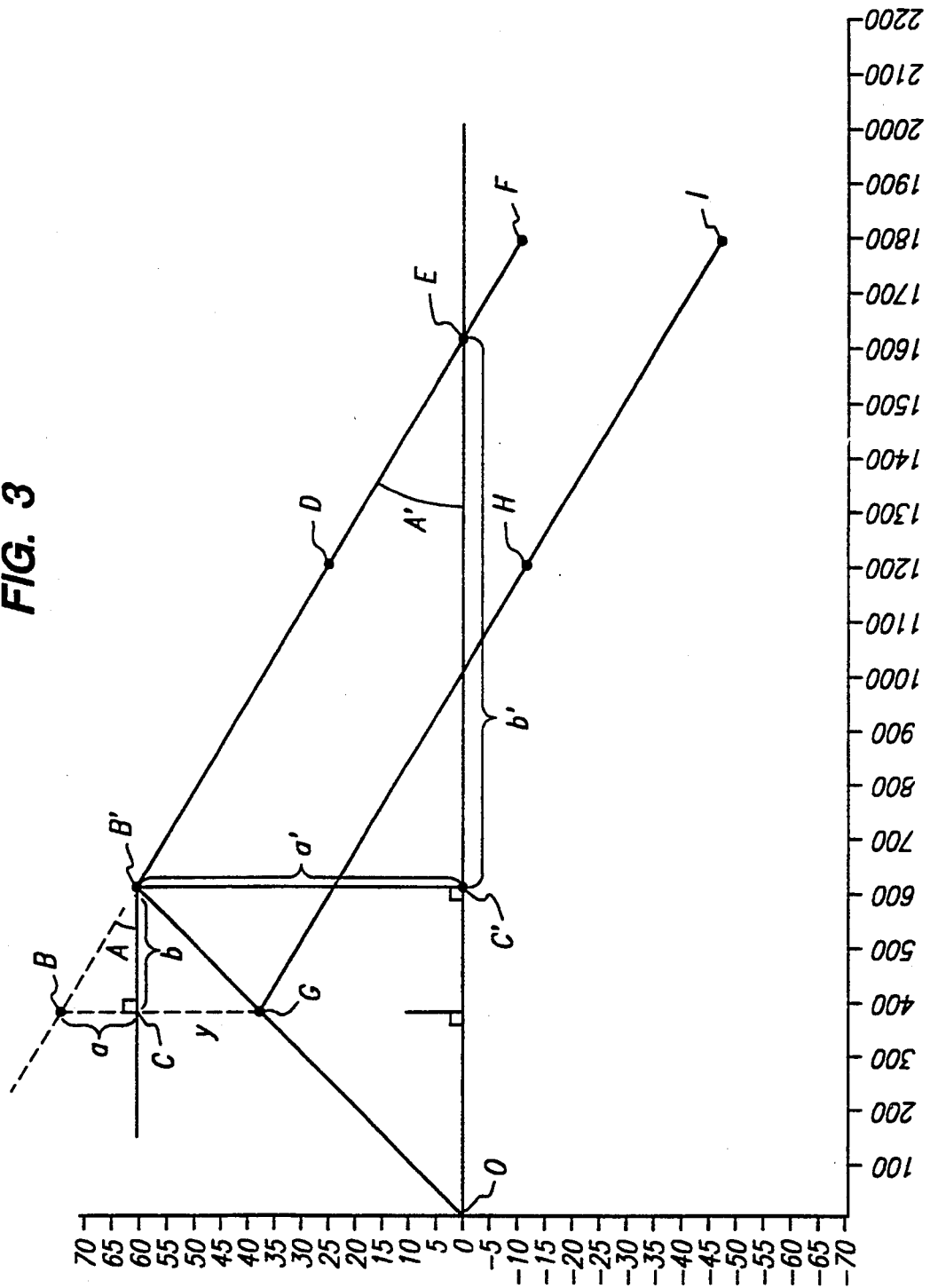
FIG. 3 is an enlarged version of the graph of FIG. 2e with additional features added to further illustrate the present invention.

Referring now to FIG. 3, an enlarged version of the graph of FIG. 2e is shown with additional features added to further illustrate the technique of the present invention. Points which are the same on the graphs of FIGS. 2e and 3 are identified with the same reference characters.

Using the same examples described above with respect to FIGS. 2a–2e, FIG. 3 shows, at point G, that the first and second actual bit cells produced a $COUNT_{ACTUAL\_HIGH}$ value equal to 40. In accordance with the present invention, a correction value is added to this count in order to produce the value shown at point B in the figure. The value at point B can therefore be represented by the equation $COUNT_{CORRECTED} = COUNT_{ACTUAL\_HIGH} + CORRECTION$.

Point B represents a point on the line B'DEF, evaluated at time = $T_{ACTUAL\_HIGH}$, which corresponds to the conclusion of the high period of the actual bit cell. By making this adjustment before the count-down operation begins, one thereby ensures that the subsequently decreasing count will proceed along the line BB'DEF, so that the resulting count for the first actual bit cell will be equal to $COUNT_{EXPECTED\_LOW0}$, and that the resulting count for the second actual bit cell will be equal to $COUNT_{EXPECTED\_LOW1}$.

A method for obtaining the value of $COUNT_{CORRECTED}$ will now be derived. It can be seen from the figure that CORRECTION = a + y, where a is the length of the line BC, and y is the length of the line CG. Therefore, $$\begin{aligned} COUNT_{CORRECTED} &= COUNT_{ACTUAL\_HIGH} + CORRECTION \\ &= COUNT_{ACTUAL\_HIGH} + a + y \\ &= (COUNT_{ACTUAL\_HIGH} + y) + a \\ &= COUNT_{EXPECTED\_HIGH} + a \\ &= T_{EXPECTED\_HIGH} \times RATE_{UP} + a. \end{aligned}$$

The value of "a" can be found from the equation a = b × tan A, where b is the length of the line CB' and A is the acute angle formed by BB'C. It will also be observed that the quantity tan A corresponds to the slope of the line representing the counter value during the low period of the bit cell.

The value of b can be readily calculated from the equation $b = T_{EXPECTED\_HIGH} - T_{ACTUAL\_HIGH}$, where $T_{EXPECTED\_HIGH}$ is known from the design of the system, and $T_{ACTUAL\_HIGH}$ is measured.

From geometric principles, it can be ascertained that A = A' where A' is the angle formed by B'EC' so tan A = tan A' = a'/b' where a' is the length of the line B'C' and b' is the length of the line C'E. The value of a' is already known, since it is equal to $COUNT_{EXPECTED\_HIGH} = T_{EXPECTED\_HIGH} \times RATE_{UP}$. The value of b' can also readily be determined by observing that $b' = (T_{EXPECTED\_LOW0} + T_{EXPECTED\_LOW1})/2$.

It will be observed that the value of a'/b' is equal to the rate at which the count is decreased during a low period of the bit cell. This value, $RATE_{DOWN}$, is a constant that is known at the time the system is designed. Consequently, in practice, it is unnecessary to perform calculations to determine this value at the time that the count is to be corrected.

We can now determine the corrected count according to the equation:

$$\begin{aligned} COUNT_{CORRECTED} &= T_{EXPECTED\_HIGH} \times RATE_{UP} + a \\ &= T_{EXPECTED\_HIGH} \times RATE_{UP} \\ &\quad + ((a'/b') \times (T_{EXPECTED\_HIGH} - T_{ACTUAL\_HIGH})), \end{aligned}$$

where a' and b' are computed, as indicated above, from known quantities.

It can be shown that the final count produced in accordance with the present invention is $COUNT_{FINAL} = COUNT_{CORRECTED} - T_{ACTUAL\_LOWx} \times RATE_{DOWN}$, where $T_{ACTUAL\_LOWx}$ is either $T_{ACTUAL\_LOW0}$ or $T_{ACTUAL\_LOW1}$, depending on which bit cell is received, and that this final count has the same value that would have been produced had the errors not been introduced into the high and low periods of the received bit cell.

The above equations were derived with respect to an example in which the error caused the high period of the actual bit cell to be shortened, and the low period of the actual bit cell to be lengthened. However, these equations are equally applicable when the problem is reversed, that is, when the high period of the actual bit cell is lengthened, and the low period of the actual bit cell is shortened. This situation is illustrated in FIGS. 4a–4e.

FIGS. 4a and 4b represent expected bit cells encoded, respectively, to represent "0" and "1" values.

FIG. 4c illustrates an actual bit cell, representing a "0" value, in which the high period has been lengthened by 200 $\mu$S and the low period shortened by 200 $\mu$S, because of a hardware error such as an incorrect gain setting produced by the AGC hardware. FIG. 4d similarly illustrates an actual bit cell, this time representing a "1" value, in which the high period has been lengthened by 200 $\mu$S and the low period shortened by 200 $\mu$S.

FIG. 4e is a graph of count values for the bit cells of FIGS. 4a–4d, plotted as a function of time. It can be seen that in this situation, the value of $COUNT_{ACTUAL\_HIGH}$, represented by the point G' is too high, because the count_up operation has continued too long. It can also be seen that the count_down operation is too short, so that the final count value (point H'=53 and I'=13) is positive, regardless of how the actual bit cell was encoded.

In accordance with the present invention, this situation is also corrected by substituting for the value $COUNT_{ACTUAL\_HIGH}$, the value $COUNT_{CORRECTED}$, which is computed exactly as above. That the same equations as above are also applicable in the situation where the high period is erroneously extended and the low period erroneously shortened can be seen from the fact that the value for b will become negative because of the order in which the subtraction is performed. The value for a'/b' (=tan A) remains positive, however, so a negative value of "a" is computed, causing the value of $COUNT_{CORRECTED}$ to be less than the value of $COUNT_{EXPECTED\_HIGH}$.

Figure 5:
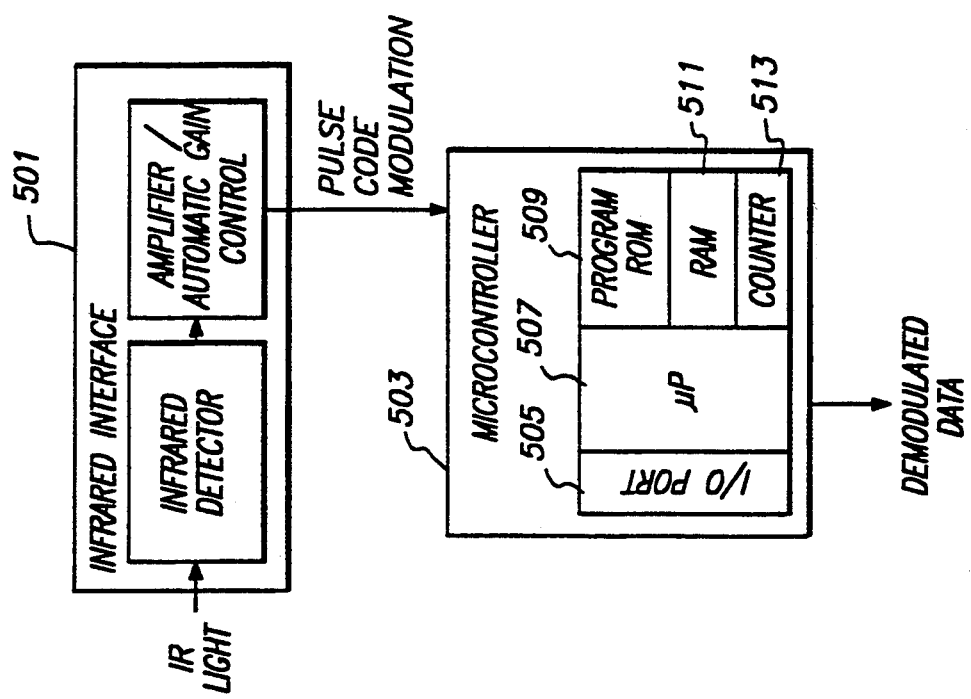
FIG. 5 is a block diagram of a preferred embodiment of the present invention for receiving and demodulating a pulse code modulated infrared light beam.

A preferred embodiment of the present invention for receiving and demodulating a pulse width modulated infrared light beam will now be described With reference to FIG. 5. Infrared light is detected by the infrared interface 501, which converts the light into a corresponding data stream in the form of a pulse code modulated serial electrical signal which utilizes pulse width modulation to encode each of the bits. The infrared interface 501 is preferably a Sony TM SBX1610-51 Infrared Remote Control Receiver, which converts a pulse code modulated 40 kHz carrier into the pulse code modulated serial data stream. However, any infrared detector with an automatic gain control circuit can be substituted for this particular device. The design and use of infrared interfaces are well known to those skilled in the art, and are not described here in detail.

The output of the infrared interface 501 is connected to an input of a microcontroller 503, whose function it is to monitor the infrared bus for traffic and demodulate the infrared protocol when it is detected. The microcontroller 503 is preferably a Motorolla MC68HC05E1/MC68HC705E1 microcontroller, which includes an I/O Port 505, a microprocessor 507, a program read only memory (ROM) 509 for storing program instructions, and a random access memory (RAM) 511. The ROM 509 contains a program which causes the microprocessor 507 to demodulate the incoming pulse code modulation signal in accordance with the teachings of this description.

The counter 513 that is used in this embodiment of the demodulation method is kept in a memory location of the RAM 511, and is maintained by software routines. The count-down and count-up intervals (i.e., the interval of time between each sampling of the bit cell) are controlled by the execution times of the software routines, which are in turn determined by the number of instructions in the software routines, the number of clocks required to execute each of the microprocessor instructions, and the speed of the clock signal that is applied to the microcontroller 503.

The microcontroller 503 may be programmed to implement the demodulation technique fully described above, including sampling the bit cell and counting up for so long as the bit cell is in a high period, determining a corrected count value in accordance with the equations set forth above, and then sampling the bit cell and counting down for so long as the bit cell is in a low period. The sign of the final count value would then correspond to whether the bit cell was encoded as a "0" or a "1". However, several alternative embodiments exist, which may be used alone or in combination.

The first of these alternatives is the use of integer math for all of the calculations, so that no fractional count values exist. The use of integer math does not introduce any unacceptable errors, and is advantageous because the instruction set of the preferred microcontroller 503 only supports integer math operations. If it is, nonetheless, desired to keep track of fractional count values, then additional software algorithms, such as well-known algorithms for floating point arithmetic, must also be stored in the microcontroller 503.

In practice, the program being executed in the microcontroller 503 is constrained to run in a finite period of time in order to maintain a predetermined sample interval of the bit cell. It is also necessary that the count correction operation be performed at the boundary between the high portion of the bit cell and the low portion of the bit cell. However, the execution time associated with performing an exact calculation in accordance with the above equations exceeds the sample interval. This causes an error to be introduced in the value of the final count value at the end of the bit cell evaluation.

Two solutions exist for this problem. One is to apply an additional correction value at the end of the bit cell evaluation, in order to compensate for the time required to calculate the compensation factor. This solution, however, requires the computation of floating point operations, which complicates the necessary software. Furthermore, the execution time of floating point operations is generally not a constant, but instead is a function of the parameters being operated upon. Consequently, the additional correction amount would be difficult to determine.

The other solution is to reduce the time required to calculate the corrected count, so that this computation time is less than a sample interval. This solution is preferred because it does not introduce significant errors into the demodulation process, and it does not require the computation of an additional correction factor. A second embodiment of the invention, which incorporates this second solution, will now be described in more detail.

For the purpose of describing this alternative embodiment, the expected bit cell periods will be taken to be:

$T_{EXPECTED\_HIGH}$=600 microseconds $T_{EXPECTED\_LOW0}$=600 microseconds $T_{EXPECTED\_LOW1}$=1200 microseconds.

Also, the sample intervals are:

$T_{UP} = 10$ microseconds $T_{DOWN} = 15$ microseconds.

From the above values, it can be determined that $COUNT_{EXPECTED\_HIGH} = T_{EXPECTED\_HIGH}/T_{UP} = 600\ \mu S/10\ \mu S = 60$. If an error were introduced so that an actual bit cell had periods of $T_{ACTUAL\_HIGH} = 396\ \mu S$ and $T_{ACTUAL\_LOW} = 1398\ \mu S$, then the uncorrected count at the end of the high period would be equal to 39 (assuming that integer arithmetic is used). If the corrections are determined in the manner described above, then a value of 13 will be added to the $COUNT_{EXPECTED\_HIGH}$ value of 60, to produce a value of $COUNT_{CORRECTED} = 73$ prior to evaluating the low period of the bit cell. In accordance with this alternative embodiment, however, an error value is approximated merely by taking half the difference between the expected count and the actual count. That is, $CORRECTION_{APPROX} = (COUNT_{EXPECTED\_HIGH} - COUNT_{ACTUAL\_HIGH})/2$. Then, $COUNT_{CORRECTED} = COUNT_{EXPECTED\_HIGH} + CORRECTION_{APPROX}$. In the above example, we would have: $CORRECTION_{APPROX} = (60 - 39)/2 = 21/2 = 10$ (integer), and $COUNT_{CORRECTED} = 60 + 10 = 70$.

Using this approximated correction count as an initial value, and then counting down at a rate of once every 15 $\mu S$ for the duration of the low period of the bit cell ($= T_{ACTUAL\_LOW} = 1398\ \mu S$), it is seen that a final count value of $-23$ is produced, compared with the more accurate value of $-20$ that is produced if no approximations are used. This is an acceptable result, because the goal of the evaluation is to determine whether a "1" or a "0" was transmitted, and only the sign of the final count indicates the value of the bit cell; the magnitude of the value in the counter is irrelevant.

The above approximation method achieves acceptable results when the difference between the ratio a/y and the approximation constant, 1/2, is not very large. Those skilled in the art will recognize that when the ratio a/y differs substantially from 1/2, then another fraction may be used as an approximation constant.

Figure 6:
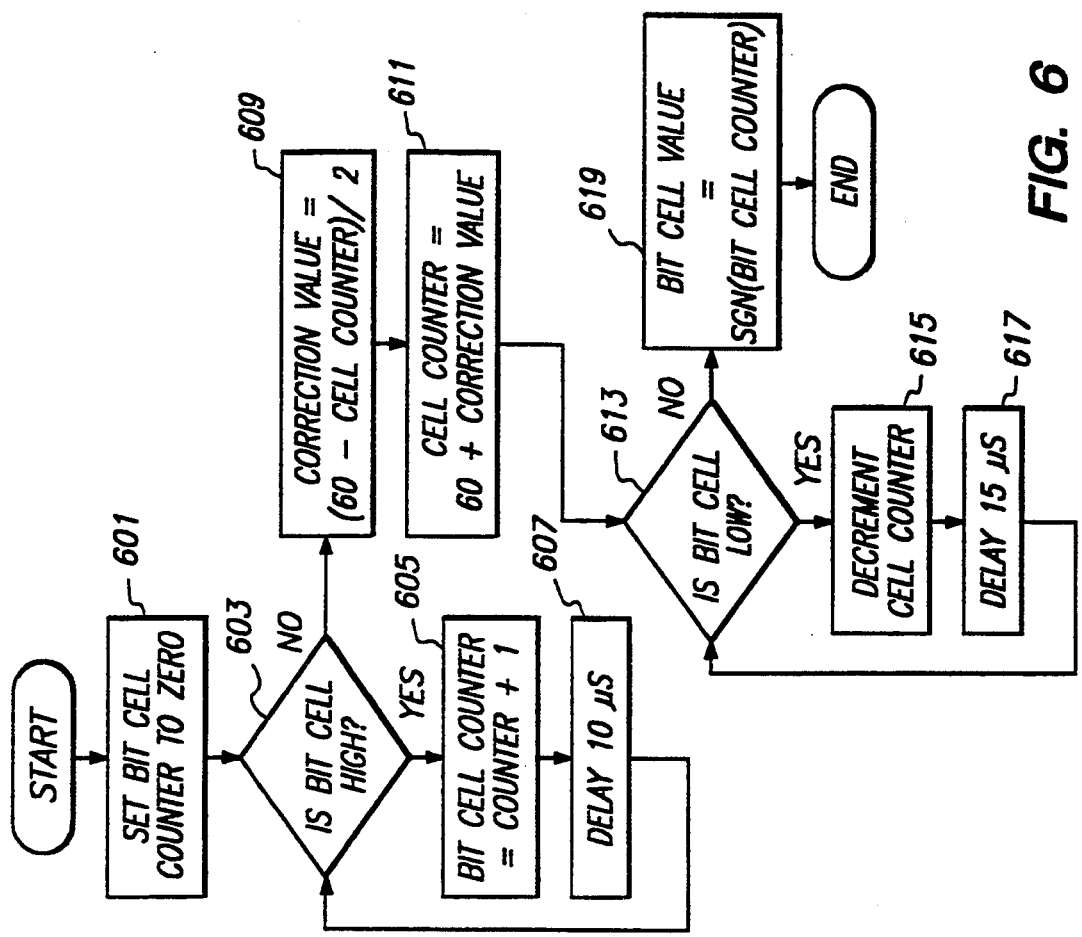
FIG. 6 is a flowchart which illustrates a method in accordance with the present invention.

Operation of the microcontroller 503 will now be described with reference to the flowchart of FIG. 6. In the illustrated embodiment, the microcontroller 503 is programmed to make the above-described approximation, rather than accurately computing a corrected count value.

The process of demodulating a bit cell starts, at the beginning of a high period of the bit cell, at block 601, where the counter 513 is initialized to a value of zero. Next, at block 603, the bit cell is sampled to determine whether it is in the high period or the low period. If it is in the high period, then execution continues at block 605, where the value in the counter 513 is increased by one. Next, at block 607, the microprocessor 507 causes further program execution to be halted for a period of 10 microseconds, after which time execution begins again at block 603. As long as the bit cell remains in the high period, the loop comprising blocks 603, 605 and 607 will be repeated, during which time the value in the counter 513 will increase by one every 10 microseconds.

When the test at block 603 indicates that the bit cell is no longer in the high period, the microprocessor 507 continues its processing beginning at block 609 so that it can determine a corrected counter value. At block 609, the correction value is determined by taking half the value of the difference between 60 and the actual value stored in the counter 513. Next, at block 611, this correction value is added to 60, and the result stored back into the counter 513. Processing then continues at block 613.

Blocks 613, 615 and 617 form a loop in which the value in the counter 513 is decremented once every 15 microseconds for so long as the bit cell is in a low period. When, at block 613, it is determined that the bit cell is no longer in a low period, processing continues at block 619, where the value of the bit cell is determined by examining the sign of the final value of the counter 513. If the sign of the final count value is positive, then the bit cell value is "0" and if the sign of the final count value is negative, then the bit cell value is "1".

The invention has been described with reference to a particular embodiment. However, it will be readily apparent to those skilled in the art that it is possible to embody the invention in specific forms other than those of the preferred embodiment described above. This may be done without departing from the spirit of the invention. For example, the variously illustrated embodiments are described with reference to a bit cell that has been encoded in a beam of infrared light. This, however, is by no means a requirement of the invention, which is applicable to any type of communication medium which utilizes pulse width modulation. Also, the source of the introduced error has been described as an erroneous gain setting produced by the AGC hardware. However, it will be apparent to those skilled in the art that what is pertinent to this invention is the manifestation of the error, rather than the physical cause.

Also, the variously described embodiments have used a technique in which counts are incremented or decremented by one, at different increment and decrement rates. However, alternative embodiments can increment by values other than one, and decrement by values that differ from the increment values. Further, increment and decrement rates may vary from those shown, and may be equal to one another, so long as the resultant counts are equivalent to those as described as above. Additionally, it is not essential that an actual count operation be performed. For example, signal integration techniques may accomplish the same result.

Consequently, the preferred embodiment is merely illustrative and should not be considered restrictive in any way. The scope of the invention given by the appended claims, rather than the preceding description, and all variations and equivalents which fall within the range of the claims are intended to be embraced therein.

What is claimed is:

1. A method of demodulating a pulse width modulated signal previously modulated with at least one data value selected from the group consisting of first and second values, said pulse width modulated signal comprising at least one bit cell corresponding to said at least one data value, each of said bit cells comprising a first period and a second period, said first period having a first duration and said second period alternatively having a second duration or a third duration in correspondence with said corresponding data value being, alternatively, said first value or said second value, said method comprising the steps of:

for each of said bit cells:
  sensing an actual duration of said first period of said bit cell;
  generating an actual first signal value that is proportional to said actual duration of said first period of said bit cell;

using said actual first signal value and an expected first signal value to determine a first adjustment amount, and then adjusting said actual first signal value by said first adjustment amount;

sensing an actual duration of said second period of said bit cell;

further adjusting said adjusted actual first signal value by a second adjustment amount to produce a final adjusted signal value, said second adjustment amount being proportional to said actual duration of said second period of said bit cell; and generating a signal alternatively having a first value or a second value in correspondence with said final adjusted signal alternatively being greater than or not greater than a reference value.

2. The method of claim 1, wherein said first period precedes said second period in each said bit cell.

3. The method of claim 1, wherein said first period is a high period, and said second period is a low period.

4. The method of claim 1, wherein said second adjustment amount has a sign that is opposite in polarity to a sign of said first adjustment amount.

5. The method of claim 1, wherein said reference value is 0.

6. The method of claim 1, wherein said pulse width modulated signal is a pulse width modulated infrared light beam.

7. The method of claim 1, wherein said step of determining said first adjustment amount comprises the steps of:

determining a time difference by subtracting a duration of an actual first period of said bit cell from a duration of an expected first period of said bit cell;

multiplying said time difference by a predetermined ratio to produce said first adjustment amount, said predetermined ratio representing a proportion by which said adjusted actual first signal value is adjusted per unit of time during said further adjusting step.

8. A method of demodulating a pulse width modulated signal previously modulated with at least one data value selected from the group consisting of first and second values, said pulse width modulated signal comprising at least one bit cell corresponding to said at least one data value, each of said bit cells comprising a first period and a second period, said first period having a first duration and said second period alternatively having a second duration or a third duration in correspondence with said corresponding data value being, alternatively, said first value or said second value, said method comprising the steps of:

for each of said bit cells:

initializing an actual count value to a first count value;

repetitively sampling said pulse width modulated signal at first intervals during said first period of said bit cell;

adjusting said actual count value by a first increment at each of said first intervals;

detecting an end of said first period and, in response thereto, using said adjusted actual count value and an expected count value to determine a corrected count value;

repetitively sampling said pulse width modulated signal at second intervals during second period of said bit cell;

adjusting said corrected count value by a second increment at each of said second intervals;

detecting an end of said second period and, in response thereto, generating a signal alternatively having a first value or a second value in correspondence with said adjusted corrected count alternatively being greater than or not greater than a reference value.

9. The method of claim 8, wherein said first period precedes said second period in each said bit cell.

10. The method of claim 8, wherein said first period is a high period, and said second period is a low period.

11. The method of claim 8, wherein said second increment has a sign that is opposite in polarity to a sign of said first increment.

12. The method of claim 8, wherein said reference value is 0.

13. The method of claim 8, wherein said pulse width modulated signal is a pulse width modulated infrared light beam.

14. The method of claim 8, wherein said corrected count value is determined by adding to said expected count value an amount substantially equal to a frequency of said second intervals multiplied by a difference in time between a duration of an expected first period of said bit cell and a duration of an actual first period of said bit cell.

15. The method of claim 14, wherein further said step of determining said corrected count value is performed with use of integer arithmetic only.

16. The method of claim 8, wherein the step of determining said corrected count value comprises the steps of:

subtracting said adjusted actual count value from said expected count value to produce a difference value;

multiplying said difference value by one half; and adding one half said difference value to said expected count value to produce said corrected count value.

17. The method of claim 16, wherein the steps of subtracting, multiplying and adding are performed only when said adjusted actual count value is less than said expected count value, and wherein said step of determining said corrected count value further comprises the step of using said adjusted actual count value as said corrected count value when said adjusted actual count value is not less than said expected count value.

18. An apparatus for demodulating a pulse width modulated signal previously modulated with at least one data value selected from the group consisting of first and second values, said pulse width modulated signal comprising at least one bit cell corresponding to said at least one data value, each of said bit cells comprising a first period and a second period, said first period having a first duration and said second period alternatively having a second duration or a third duration in correspondence with said corresponding data value being, alternatively, said first value or said second value, said apparatus comprising:

first sensing means for sensing an actual duration of said first period of said bit cell;

first count means, coupled to said first sensing means, for generating an actual count value that is proportional to said actual duration of said first period of said bit cell;

count correction means, coupled to said first count means, for using said actual count value and an expected count value to determine a corrected count value;

second sensing means for sensing an actual duration of said second period of said bit cell;

second count means, coupled to said count correction means and said second sensing means for adjusting said corrected count value by an adjustment amount to produce a final adjusted count, said adjustment amount being proportional to said actual duration of said second period of said bit cell; and signal generating means, coupled to said second count means, for generating a signal alternatively having a first value or a second value in correspondence with said final adjusted count alternatively being greater than or not greater than a reference value.

19. The apparatus of claim 18, wherein said first period precedes said second period in each said bit cell.

20. The apparatus of claim 18, wherein said first period is a high period, and said second period is a low period.

21. The apparatus of claim 18, wherein said pulse width modulated signal is a pulse width modulated infrared light beam, and wherein said apparatus further comprises:

an infrared interface, coupled to said first sensing means, for detecting said pulse width modulated infrared light beam and producing therefrom a pulse width modulated electrical signal which is supplied to said first sensing means.

* * * * *